United States Patent [19]

Spierings

[11] Patent Number: 4,716,317
[45] Date of Patent: Dec. 29, 1987

[54] CONTROL METHOD FOR AN INTEGRATED CIRCUIT USING A THREE-LEVEL CLOCK PULSE SIGNAL

[75] Inventor: Alphons F. E. B. Spierings, Breda, Netherlands

[73] Assignee: U.S. Philips Corporation, New York, N.Y.

[21] Appl. No.: 910,104

[22] Filed: Sep. 22, 1986

[30] Foreign Application Priority Data

Oct. 21, 1985 [NL] Netherlands ......................... 8502860

[51] Int. Cl.$^4$ ............................................. H04N 5/21
[52] U.S. Cl. ................................... 307/520; 307/473; 307/480; 307/549; 358/213.26; 375/104; 375/113; 328/165
[58] Field of Search ................ 375/104, 113; 328/165; 307/520, 549, 473, 480; 358/213

[56] References Cited

U.S. PATENT DOCUMENTS

| | | | |
|---|---|---|---|
| 4,549,215 | 10/1985 | Levine | 358/213 |
| 4,551,759 | 11/1985 | Crabtree | 358/213 |
| 4,556,851 | 12/1985 | Levine | 358/213 |
| 4,581,651 | 4/1986 | Miyata et al. | 358/213 |

*Primary Examiner*—John S. Heyman
*Attorney, Agent, or Firm*—Robert T. Mayer; Steven R. Biren

[57] ABSTRACT

In an integrated circuit of the type having a reset transistor for a capacitance succeeded by an active information charge transfer transistor for the capacitance, a clock pulse signal at the common switching electrode results in opposite-polarity switching. It is found in practice that a noise pattern present at a reset pulse level in the circuit output signal may cause problems in the case of further signal processing operations in the device. To solve these problems, a control method is used with a clock pulse signal which has three signal levels, a first level at which only the reset transistor is conducting, a second level at which the two transistors are both non-conducting, and a third level at which only the information charge transfer transistor is conducting. The result is that part of the noise pattern is suppressed, so that further signal processing operations in the device, for example, by a known signal clamping circuit and a known signal sample-and-hold circuit, can be performed in an acceptable manner.

2 Claims, 4 Drawing Figures

CONTROL METHOD FOR AN INTEGRATED CIRCUIT USING A THREE-LEVEL CLOCK PULSE SIGNAL

BACKGROUND OF THE INVENTION

The invention relates to a control method for an integrated circuit formed with a common switching electrode for at least two oppositely switchable transistors, which are operative in the integrated circuit for transferring an information charge or for resetting, respectively. A connection of the switching transistors is coupled to a capacitance for picking up the information charge and for resetting under the transistor control of a clock pulse signal occurring at the switching electrode. The invention also relates to a device suitable therefor.

An integrated circuit of this type may form part of a more complex integrated circuit suitable for use in, for example, television. A frame transfer device operating as an opto-electronic solid-state charge transfer sensor whose data is mentioned under numbers NXA1010 and NXA1020 in a Philips data handbook is mentioned as an example. The sensor comprises, in a semiconductor body, a pick-up member, an information storage member and a parallel-in, series-out shift register member comprising three output shift registers. The circuit comprising the two switching transistors and the common switching electrode is present at the output of each of the three output shift registers. The charge transfer transistor is the last in the shift register row of such transistors, while the required charge is supplied via the reset transistor for periodically resetting the capacitance charges at the charge transfer transistors in the row. Under the control of three 120° phase-shifted clock pulse signals the three output shift registers, likewise shifted in phase, are operative with the charge transfer transistors and the associated reset transistor. By using the common switching electrode a resetting of the last capacitance charge in the row effected via the reset transistor is succeeded by an information charge transfer from the next-to-last capacitance.

The picture signal supplied by the output shift register by means of the described control method is supplied for further signal processing operations in the described sensor via a signal amplifier which is also integrated. Due to the control method, the picture signal occurs with a pulse shape caused by cross-talk from the switching clock pulse signal, while the reset pulse level only comprises noise and the signal pulse level comprises picture information with noise. To remove the cross-talk clock pulse and to obtain a continuous picture signal, this is applied in known manner to a series arrangement of a clamping circuit for fixing the reset pulse level and a subsequent signal sample-and-hold circuit operating at the signal pulse level. After the desired further signal processing operations the picture signal can be applied for display to a picture display device, either (or not) after storage in a signal recording and display device.

The advantages of the fact that the switching electrode for the last charge transfer transistor in the shift register row and the reset transistor are common are the absence of an extra electrode connection to the integrated circuit for the supply of a separate reset clock pulse signal on the one hand and the supply electrode region on the semiconductor body required for this purpose in the integrated circuit on the other hand. In the embodiment described, comprising the three output shift registers, three extra electrode connections and associated supply electrode regions would be required on the semiconductor body. Both the lack of space for the three extra electrodes and the additional costs involved for each electrode connection leads to the embodiment with the common switching electrode.

It is found in practice that when picking up a picture with low light levels the picture signals for display obtained with the described sensor and control method may have an unacceptable noise level. When the picture signal is displayed, dark scene parts show disturbing noise which is less conspicuous in bright scene parts.

SUMMARY OF THE INVENTION

It is an object of the invention to realize a control method for the integrated circuit formed with a common switching electrode for at least two oppositely switchable transistors in which the output signal thereof has a greatly reduced noise pattern. To this end the control method according to the invention is characterized in that the clock pulse signal has at least three signal levels, the reset transistor being conducting and the charge transfer transistor being non-conducting at a first clock pulse signal level, the two transistors being non-conducting at a subsequent second clock pulse signal level and the charge transfer transistor being conducting and the reset transistor being non-conducting at a subsequent third clock pulse signal level.

The invention is based on the recognition that the embodiment of the integrated circuit with the common switching electrode for the oppositely switchable transistors leads to an unacceptable noise level after signal clamping and signal sampling in the known control method. Resetting the capacitance charge in known manner by the reset transistor and supplying immediately thereafter the information charge to the capacitance causes the pulse-shaped output signal supplied by the integrated circuit to have a noise pattern causing problems in further signal processing operations. The use of the control method according to the invention suppresses a part of the problematic noise pattern so that the pulse-shaped output signal has noise-free portions near the reset level. The image sensor described has been given as an example of an integrated circuit with a common switching electrode for the oppositely switchable transistors. Generally the method according to the invention can advantageously be used in integrated circuits having the described construction in those areas where the local noise pattern suppression is desired.

A device for use of the control method according to the invention, comprising the integrated circuit and a signal generator is characterized in that the signal generator for supplying the clock pulse signal having at least three clock pulse signal levels is coupled to the common switching electrode of the integrated circuit.

BACKGROUND OF THE INVENTION

The invention will be described in greater detail by way of example, with reference to the accompanying drawing, in which.

DESCRIPTION OF THE PREFERRED EMBODIMENTS

Figure 1:
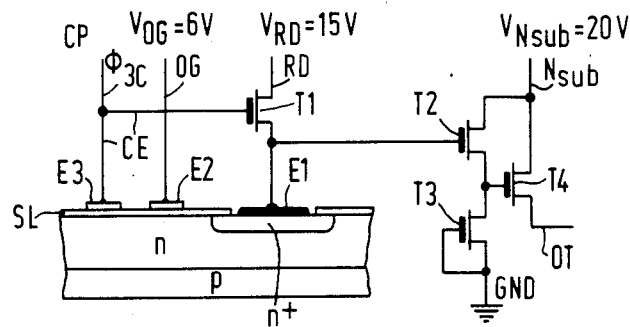
FIG. 1 shows partly in a cross-section a circuit associated with an integrated circuit in which the control method according to the invention can be used advantageously.

FIG. 1 shows a cross-section through a p- and n-type semiconductor body of an integrated circuit comprising an n-substrate on a p-substrate. A higher doped n+ region on which an electrode E1 is provided is present in the n-substrate. Furthermore, two electrodes E2 and E3 are shown which are present on an electrically insulating layer SL provided on the semiconductor body. FIG. 1 also shows a circuit diagram with transistors T1, T2, T3 and T4 which are also integrated in the semiconductor body and connections to the electrodes E and the transistors T. The transistors T are shown as MOS-transistors. The gate electrode of the transistor T1 is connected to the electrode E3 and together they constitute a common electrode CE. The source electrode of the transistor T1, which is connected to the electrode E1, is connected to the gate electrode of the transistor T2. The source electrode of the transistor T2 is connected to the drain electrode of the transistor T3 and the gate electrode of the transistor T4. The drain electrodes of the transistors T2 and T4 are connected together, while the gate electrode of the transistor T3 is connected to the source electrode thereof.

The structure of the integrated circuit and the circuit diagram shown in FIG. 1 is given in a Philips Data Handbook for the frame transfer sensors NXA1010 and NXA1020. The transistors T2, T3 and T4 are present between a supply terminal $N_{sub}$ and a grounded connection GND. A supply voltage $V_{Nsub}=20$ V is given as an example. The source electrode of the transistor T4 is connected to an output terminal OT of the integrated circuit. The drain electrode of the transistor T1, which is operative as a reset transistor, is connected to a connection RD to which, for example, a voltage $V_{RD}=15$ V is applied. The electrode E2 is connected to a connection OG and, under the supply of a voltage $V_{OG}=6$ V, it is operative as an output gate of the integrated circuit. The common electrode CE constituted by the gate electrode of the transistor T1 and the electrode E3 is connected to a connection $\phi_{3C}$ which is associated with the horizontal transfer clock output register of the integrated circuit. A clock pulse signal CP is applied via this connection to the transistor T1 and the electrode E3. The electrode E3 forms part as a switching electrode of a transistor formed in the semiconductor body of the integrated circuit, which transistor is present below the electrodes E3, E2 and E1. The electrode E1 has a capacitance relative to ground of the semiconductor body of the integrated circuit which is reset via the transistor T1 and then receives an information charge from below the electrodes E3 via the formed transistor E1, E2, E3. The electrode E3 is the last in a row of electrodes occurring in a parallel-in, series-out output shift register of the integrated circuit mentioned as an example. The transistor control is such that at a high pulse voltage CP the transistor T1 is in the conducting state and the formed transistor (E1, E2, E3) is in the non-conducting state. At a low clock pulse voltage CP the transistor T1 is non-conducting and the induced transistor (E1, E2, E3) is in the conducting state. At the reset the electrode E1 obtains a reference voltage, while the supply of the information charge from below the electrode E3 corresponds to a voltage decrease at the electrode E1.

Figure 2:
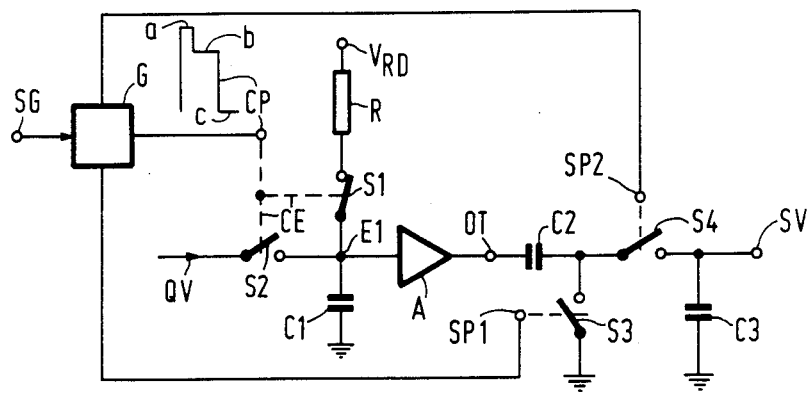
FIG. 2 shows a circuit diagram of a device suitable for use with the control method according to the invention.

A circuit diagram as shown in FIG. 2 can be given for the integrated circuit of FIG. 1. The reset transistor T1 of FIG. 1 is shown by a switch S1 and a resistor R arranged in series which are present between the supply voltage $V_{RD}$ and the electrode E1 shown as a junction point. The capacitance described with reference to FIG. 1 is denoted by C1. The formed information charge transfer transistor (E1, E2, E3) of FIG. 1 is shown as a switch S2 in FIG. 2 in which the information charge has been denoted by QV. The common switching electrode CE to which the clock pulse signal CP is applied is further shown in FIG. 2. The junction point, or in other words the electrode E1, is succeeded by a signal amplifier A comprising the transistors T2, T3 and T4 of FIG. 1. The output of the amplifier A constitutes the output terminal OT of the integrated circuit.

The circuit diagram of FIG. 2 is associated with a device in which the output signal at the terminal OT can undergo a subsequent known signal processing operation. The output terminal OT is coupled to ground via a capacitor C2 and a switch S3. A switching signal SP1 is applied to the switch S3 formed as a switching transistor. The switch S3 and the capacitor C2 operate as a signal clamping circuit (S3, C2) under the control of the clamping signal SP1. A switch S4 coupling the junction point of the capacitor C2 and the switch S3 via a capacitor C3 to ground succeeds the signal clamping circuit (S3, C2). A switching signal SP2 is applied to the switch S4 in the form of a switching transistor. The switch S4 and the capacitor C3 operate as a signal sample-and-hold circuit (S4, C3) under the control of the sampling signal SP2. The junction point of the switch S4 and the capacitor C3 is connected to a terminal SV in the device at which a signal denoted by the same reference occurs. The clock pulse signal CP, the clamping signal SP1 and the sampling signal SP2 originate from a signal generator G. For synchronizing purposes a signal SG may be applied to the signal generator G. If the described integrated circuit is used in television, the signal SG comprises, for example, clock pulse, line and/or field synchronizing information.

Figures 3A, 3B:
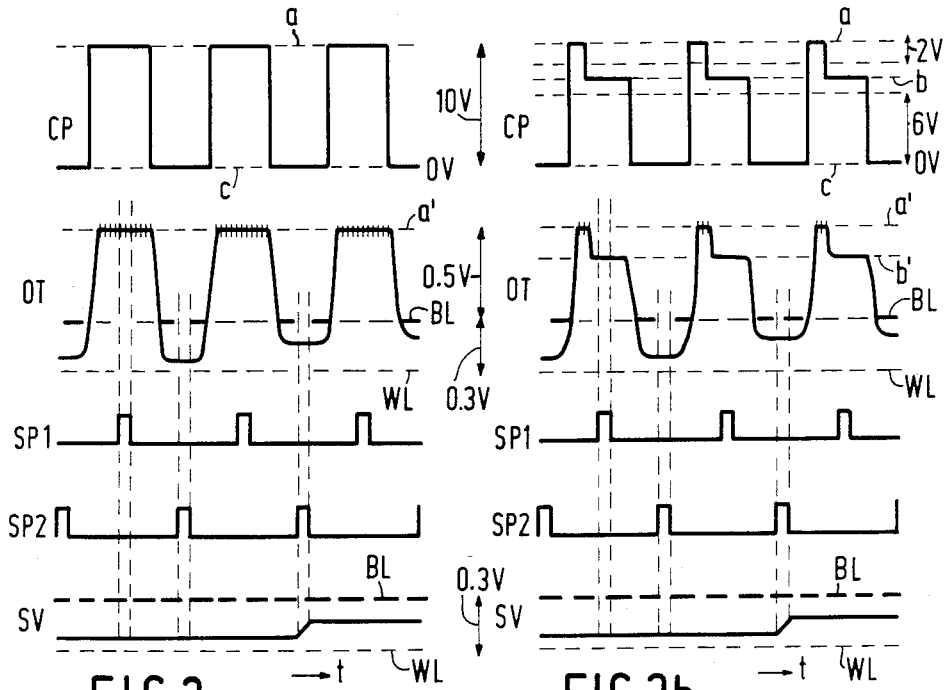
FIGS. 3a and 3b illustrate the differences between the known control method and the control method according to the invention by way of respective signal diagrams as a function of time.

In FIGS. 3a and 3b signal diagrams have been plotted as a function of time t to illustrate the differences between the known control method (FIG. 3a) and the control method according to the invention (FIG. 3b) in the device according to FIG. 2 comprising an integrated circuit according to FIG. 1 formed with the common switching electrode CE for the oppositely-switchable transistors shown as switches S1 and S2.

FIG. 3a shows the clock pulse signal CP with two clock pulse levels a and c. Starting from the data given for the described television picture pick-up device, a clock pulse amplitude of 10 V is mentioned as an example starting from a low level c=0 V. The signal at the circuit output OT is plotted as the pulse-shaped circuit output signal OT in FIG. 3a. The signal O T of FIG. 3a is shown with a reset pulse level a' and a signal pulse level between a black level BL and a white level WL. The pulse shape of the signal OT obtained by clock pulse cross-talk shows the cross-talk clock pulse with an amplitude of, for example, 0.5 V. The picture information occurs with an amplitude of, for example, 0.3 V. The signal OT is shown as an example with a picture information which decreases from near the white level WL towards the black level BL. Noise is shown at the reset pulse level a'. This noise originates from the conducting reset transistor T1 of FIG. 1. FIG. 3a shows at the signal OT an interrupted noise pattern occurring at the clock pulse frequency.

In the case of television use of the integrated circuit the pulsatorily changing circuit output signal OT of FIG. 3a is to be converted into a television picture signal which occurs without the cross-talk clock pulse and with a continuous variation. This picture signal SV is plotted in FIG. 3a between the black level BL and the white level WL with the amplitude of 0.3 V. To remove the cross-talk clock pulse and to obtain the continuously varying picture signal SV, FIG. 2 shows the series arrangement of the clamping circuit (S3, C2) and the signal sample-and-hold circuit (S4, C3) which are operating with the clamping signal SP1 and the sampling signal SP2, respectively, shown in FIG. 3a. After signal clamping, at which capacitor C2 is connected to ground potential, the signal sample is subsequently stored in the capacitor C3. Starting from the signal variation for the picture information shown at the signal OT, the signal change in the signal SV follows from the white level WL towards the black level BL. The described operation of the series arrangement (C2, S3, S4, C3) is known as a "correlated double sampling", as described in "IEEE Journal of Solid-State Circuits", Vol. SC-9, No. 1, February 1974, pages 1–12.

The control method in the integrated circuit with the clock pulse signal CP of FIG. 3a is found to lead in practice to a picture signal SV produced a picture with a disturbing noise upon display in a television display device. Dark scene parts are then found to have unacceptable noise which is less conspicuous in the case of bright scene parts. In accordance with one aspect of the invention it is recognized that this is caused by the shape of the signal OT of FIG. 3a. FIG. 3a shows that signal clamping is efected at the reset pulse level a' having the described interrupted noise pattern. Consequently, the clamping voltage across the capacitor C2 of FIG. 2 varies depending on the time-integrated noise value at the final instant of the pulse in the clamping signal SP1. The varying clamping voltage caused by the noise reaches the voltage across the capacitor C3 via the signal sampling and hence reaches the picture signal SV. This sampled noise causes the unacceptable noise in dark scene parts when the picture signal SV is displayed. As compared with the high frequency noise at the signal OT shown in FIG. 3a, the resultant sampled low frequency noise at the signal SV with the given time scale cannot be shown in a simple manner in the drawing so that it has been omited.

A solution would be to omit the common electrode CE of FIG. 1 and to provide two separate electrode connections for the control of the reset transistor T1 and the electrode E3 in the integrated circuit. This solution, which emanates from the recognition that the common electrode construction and the sampled noise are the cause of the unacceptable noise upon display, has the drawbacks of a larger area to be occupied on the semiconductor body and the aspect of costs in the case of more electrode connections.

The control method according to the invention to be described with reference to FIG. 3b is used as an electronic solution. Signal values and levels already described with reference to FIG. 3a have the same references. The clock pulse signal CP of FIG. 3b, which is also shown in FIG. 2, has three clock pulse signal levels a, b and c. The voltage level a is present for a short time with a period which is long enough for signal clamping. The voltage level b is present for the remaining duration of the half clock pulse period. FIG. 3b shows as an example that the level b may have a value which is at least 6 V from the voltage level c and at least 2 V from the voltage level a. These values are given in relation to the picture pick-up device described with reference to FIG. 1 which shows in practice that the reset transistor T1 is conducting at the level a and the charge transfer transistor (E1, E2, E3) is non-conducting, that the two transistors are non-conducting at the subsequent level b and that the charge transfer transistor (E1, E2, E3) is conducting and the reset transistor T1 is non-conducting at the subsequent level c. The result of the control with the 3-level clock pulse signal CP of FIG. 3b for the circuit output signal OT is shown in the time diagram. The reset pulse level a' at the signal OT shows the noise cause by the conducting reset transistor T1, whereas the level b' with the then non-conducting transistor is free from noise. FIG. 3b shows that the clamping signal SP1 is operative at the noise-free level b' so that no sampled noise occurs in the picture signal SV according to FIG. 3b. By the choice of the level b in the clock pulse signal CP of FIG. 3b the clamping circuit (S3, C2) of FIG. 2 is operative during part of the duration of the corresponding level b' occurring in the circuit output signal OT. The result is that no sampled noise occurs in the picture signal SV obtained in accordance with FIG. 3b, because in the noise pattern occurring at the signal OT according to FIG. 3a parts of this pattern near the reset level a' are suppressed in the signal OT of FIG. 3b.

It is to be noted for the sake of completeness that the circuit of FIG. 2, with the switch S1 closed and the switches S2, S3 and S4 open is associated with the duration in which the short-lasting resetting at the level a' in the signal OT is effected according to FIG. 3b.

The described picture pick-up device is mentioned as an example in the foregoing. Generally the structure of the clock pulse signal CP according to FIG. 3b can be used in all those cases in which an integrated circuit is formed with a common switching electrode for at least two oppositely switchable transistors if it is desired to have a noise-free level between the reset level with noise and a signal level. With respect to the use of the separate switching electrodes there is the advantage of the smaller electrode region on the integrated circuit and the smaller number of electrode connections to the circuit.

The three constant levels a, b and c are given at the clock pulse signal CP of FIG. 3b, while each level may have a level variation which is then so small that the described conducting and non-conducting states of the transistors T1 and (E1, E2, E3) are ensured.

What is claimed is:

1. A control method for an integrated circuit having a common switching electrode for controlling at least two oppositely-switchable transistors, which are operative in the integrated circuit for transferring an information charge or for performing a resetting operation, respectively, a connection of the switching transistors being coupled to a capacitance for receiving the information charge and for performing the resetting operation under the control of a clock pulse signal occurring at the switching electrode, comprising the step of providing the clock pulse signal with three signal levels, a first clock pulse signal level at which the reset transistor is conducting and the charge transfer transistor is non-conducting, a subsequent second clock-pulse signal level at which the two transistors are non-conducting and a subsequent third clock pulse signal level at which the charge transfer transistor is conducting and the reset transistor is non-conducting.

2. A device suitable for use of the control method as claimed in claim 1 in which the device comprises the integrated circuit and a signal generator, characterized in that the signal generator for supplying the clock pulse signal having at least three clock pulse signal levels is coupled to the common switching electrode of the integrated circuit.

* * * * *